United States Patent [19]

Hadley et al.

[11] Patent Number: 4,551,672
[45] Date of Patent: Nov. 5, 1985

[54] ACTIVE PROBE

[76] Inventors: Russell F. Hadley, 5101 Fedora, Troy, Mich. 48098; Carl W. Kovacs, 409 Curry, Royal Oak, Mich. 48067

[21] Appl. No.: 475,303

[22] Filed: Dec. 19, 1983

[51] Int. Cl.[4] ........................ G01R 31/02; G01R 31/08
[52] U.S. Cl. .................................................... 324/133
[58] Field of Search .................. 324/51, 52, 158 MG, 324/133

[56] References Cited

U.S. PATENT DOCUMENTS 3,872,384  3/1975  Laass ...................................... 324/51
4,353,026 10/1982  Edwards ................................ 324/51

Primary Examiner—Stanley T. Krawczewicz
Assistant Examiner—Jose M. Solis

[57] ABSTRACT

The Probe I is a diagnostic tool for use by electricians, technicians, as well as people with only elementary knowledge of electricity. Its value lies in its ability to screen test many simple as well as complicated components, by using visual as well as audio signlas, to compare the sound of a known good component to the one being tested. Many circuits can be repaired without any idea of what the circuits actually do, and many times without prints for the circuit.

1 Claim, 1 Drawing Figure

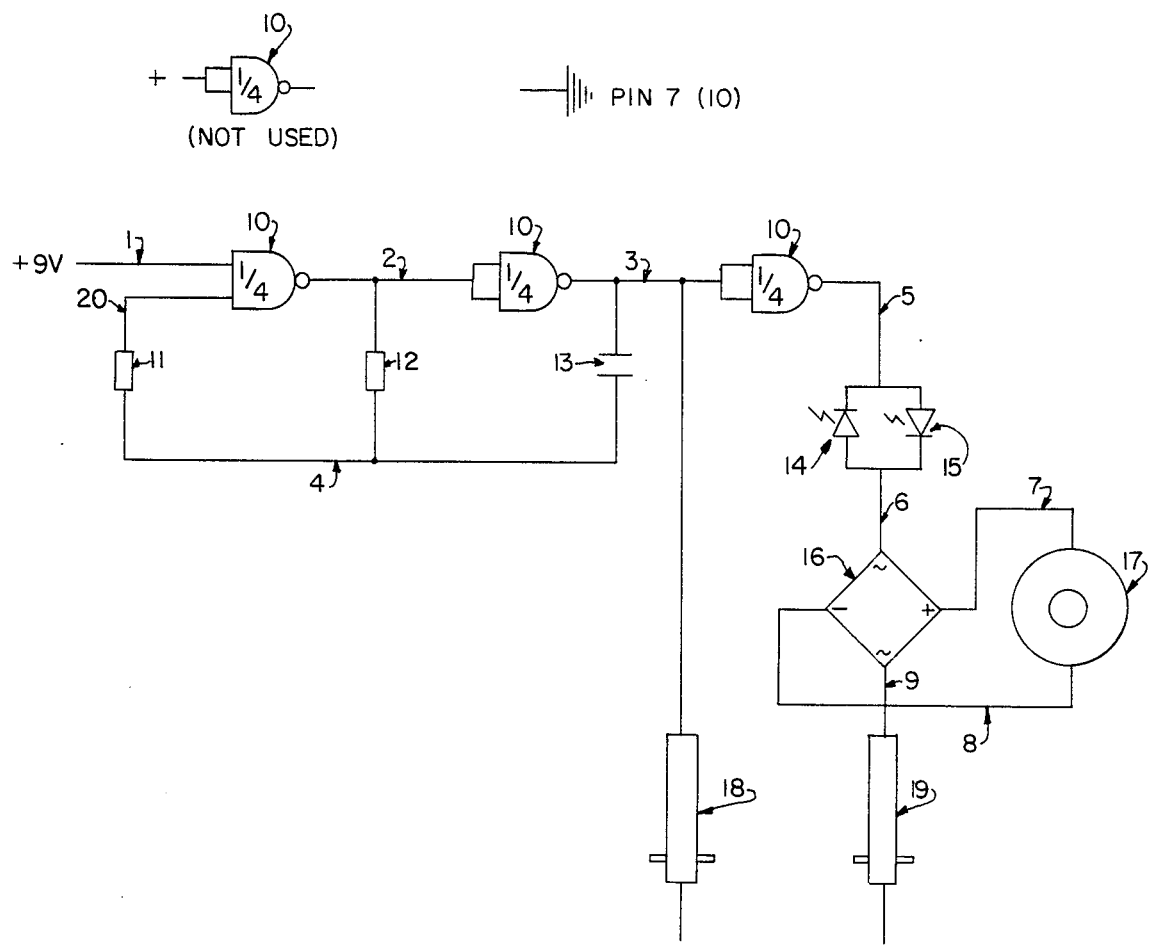

ACTIVE PROBE

BRIEF SUMMARY OF THE INVENTION

Diagnostic efforts on circuit boards can be very difficult when the circuit board contains integrated circuits, unless the board is "powered up". In many instances, this may be impossible if you do not have prints, or the proper power available. With our device, components can be screened by visual and audio comparison to known good components. The audio device used in our tester allows us to make use of very small amounts of current flow to produce a sound which is unique for most components. This device also can be used to test virtually any common component without damage to the tested component.

BRIEF DESCRIPTION OF THE DRAWINGS

The FIGURE shows a circuit diagram of the invention.

DESCRIPTION OF THE INVENTION

This unit is a component tester which is unique in that it uses a reversing polarity (at the probe ends) to check components. The signal travels through a bridge rectifier 16 which has an audio device 17 which will make a sound whenever there is a path between the probes 18 and 19.

The reversing polarity is delivered using a CMOS 4011 Nand gate integrated circuit (hence to be called IC) 10. This IC (10) has four Nand gates of which 3 are used in this unit. The inputs to the fourth gate are tied to the positive voltage of the battery to prevent the gate from oscillating. The gate output 3 is connected directly to probe 18. The gate output 5 is connected through 14 and 15 and goes into bridge rectifier 16 through the audio device 17 and back through the bridge rectifier 16 and then to the probe 19. Whenever 5 is high, then probe 19 will be high and vise versa.

Normally 1 is kept high. At start, 1 is high and 20 is low so that 2 will be high. Since 2 is high there is a voltage drop developed across resistors 11 and 12. Also since 3 is low, then 5 will be high and there will also be a voltage drop across capacitor 13. Voltage and current will start to charge capacitor 13. The voltage at 20 will start to rise at a rate determined by the combination of resistors 11 and 12, and capacitor 13. When the voltage at 20 is sufficiently high, the Nand gate (10) will cause 2 to go low. This will cause 3 to go high and 5 to go low. Then with 2 low and 20 and 3 high the voltage drops across resistors 11 and 12 and capacitor 13 will be reversed, causing the voltage at 20 to decrease until finally the Nand gate 10 is once again shifted, and the cycle is repeated. Whenever 3 is low then probe 18 will be low, and 5 will be high, which means probe 19 will be high, thus no matter at what time during the cycle, probes 18 and 19 will always have a voltage difference of about seven volts.

Anytime that there is a path for current to flow between the probes, then there will also be current flow in one or both of the light-emitting diodes 14 and 15 and also the buzzer 17 will be energized. If you are testing a diode, then current will flow only when the polarity of the probe is such that it allows flow (this will happen one half of the time). When this happens, the buzzer 17 will turn on only one half of the time. When the probes 18 and 19 are touching each other then the buzzer 17 is on both one half cycles so there is a continuous tone. The light-emitting diodes 14 and 15 will both flash alternately due to current flowing in both directions. When testing a diode, then only one light-emitting diode 14 and 15 will flash. By properly connecting the light-emitting diodes we can use the flashing light-emitting diode to indicate which probe 18 or 19 is touching the cathode.

Another unique feature is the ability of this unit to check capacitors. When the probes 18 and 19 touch the leads of a capacitor, current flows charging the capacitor. However, before the capacitor can charge, the polarity of the probes 18 and 19 changes, causing the capacitor to discharge and then charge in the other direction. The size of the capacitor (in micro-farads) determines the amount and duration of the sound of the buzzer 17. Once you have tested several capacitors you can easily recognize the general value of capacitors since the sound will depend only on capacitance and not the voltage rating of the capacitor.

When checking for current paths this unit is excellent campared to a continuity tester, due to the field effect transistors used in the CMOS IC 10. This allows us to detect a current path with a resistance of up to 100K ohms.

We claim:
1. An apparatus for screen testing and troubleshooting components, said apparatus comprising:
   first circuit means, for generating a reversing voltage, consisting of one IC, two resistors and a capacitor;
   probe means for applying said reversing voltage to a component under test and for carring current to said component under test;
   light-emitting diodes means, in series with said probe means, for indicating current flow direction and for identification of undirectional components;
   bridge rectifier means, in series with said probe means, for generating a DC current in proportion to the current at the component under test;
   audio buzzer means, for generating a sound in proportion to said current at the component under test, said audio buzzer means being energized by said bridge rectifier means.

* * * * *